US012660140B2

(12) United States Patent
Yamamoto

(10) Patent No.: US 12,660,140 B2
(45) Date of Patent: Jun. 16, 2026

(54) METAL-RESIN COMPOSITE ELECTROMAGNETIC SHIELDING MATERIAL

(71) Applicant: JX Metals Corporation, Tokyo (JP)

(72) Inventor: Yukito Yamamoto, Ibaraki (JP)

(73) Assignee: JX Advanced Metals Corporation, Toyko (JP)

( * ) Notice: Subject to any disclaimer, the term of this patent is extended or adjusted under 35 U.S.C. 154(b) by 266 days.

(21) Appl. No.: 18/580,775

(22) PCT Filed: Jul. 8, 2022

(86) PCT No.: PCT/JP2022/027154
§ 371 (c)(1),
(2) Date: Jan. 19, 2024

(87) PCT Pub. No.: WO2023/084844
PCT Pub. Date: May 19, 2023

(65) Prior Publication Data
US 2024/0341071 A1      Oct. 10, 2024

(30) Foreign Application Priority Data

Nov. 15, 2021    (JP) ................................ 2021-186021

(51) Int. Cl.
| | |
|---|---|
| *H05K 9/00* | (2006.01) |
| *B32B 15/09* | (2006.01) |
| *B32B 15/20* | (2006.01) |
| *B32B 27/36* | (2006.01) |

(52) U.S. Cl.
CPC ........... *H05K 9/0083* (2013.01); *B32B 15/09* (2013.01); *B32B 15/20* (2013.01); *B32B 27/36* (2013.01); *B32B 2250/40* (2013.01); *B32B 2250/42* (2013.01); *B32B 2307/212* (2013.01); *B32B 2307/7376* (2023.05); *B32B 2457/00* (2013.01)

(58) Field of Classification Search
None
See application file for complete search history.

(56) References Cited

U.S. PATENT DOCUMENTS

| | | | | |
|---|---|---|---|---|
| 2003/0164243 | A1* | 9/2003 | Arakawa | ................. B32B 15/08 |
| | | | | 428/209 |
| 2005/0208798 | A1 | 9/2005 | Shimoda | |
| 2008/0012493 | A1 | 1/2008 | Lee et al. | |
| 2009/0133922 | A1* | 5/2009 | Okazaki | .............. H05K 9/0096 |
| | | | | 428/209 |
| 2018/0263145 | A1 | 9/2018 | Tanaka | |
| 2021/0057304 | A1* | 2/2021 | Koyano | ................ H10W 40/10 |

FOREIGN PATENT DOCUMENTS

| | | | | |
|---|---|---|---|---|
| JP | S60125125 | A | 7/1985 | |
| JP | H01143197 | A | 6/1989 | |
| JP | H07290449 | A | 11/1995 | |
| JP | 2003285002 | A | 10/2003 | |
| JP | 2005191443 | A * | 7/2005 | ............. B32B 15/08 |
| JP | 2008021979 | A | 1/2008 | |
| JP | 2010080825 | A * | 4/2010 | ............. B32B 15/20 |
| JP | 4602680 | B2 | 12/2010 | |
| TW | 201832926 | A | 9/2018 | |
| WO | 2006098335 | A1 | 9/2006 | |

OTHER PUBLICATIONS

Takahashi—JP 2005-191443 A—Jap. D1—MT—electromagnetic shield—no bubbles—2005 (Year: 2005).*
Imamura—JP 2010-080825 A—PCT D1—Euro D1—MT—electromagnetic shield—number of bubles—2010 (Year: 2010).*
International Search Report for PCT/JP2022/027154 dated Oct. 4, 2022, 2 pages.
International Preliminary Report on Patentability for PCT/JP2022/027154 dated May 2, 2024, 4 pages.
Extended European Search Report for corresponding EP Application No. 22892347.0, dated Feb. 12, 2025, 7 pages.
Taiwan Office Action for corresponding Taiwanese Application No. 111127119 dated Mar. 8, 2023, 6 pages.
Taiwan Office Action for corresponding Taiwanese Application No. 111127119 dated Nov. 9, 2023, 5 pages.
Office Action Reconsideraton Report by Examiner before Appeal for the corresponding Japanese Patent Application No. 2023-559421 issued on May 13, 2025, 8 pages.
Notice of Termination of Reconsideration by Examiner before Appeal Proceedings for corresponding Japanese Patent Application No. 2023-559421 issued May 13, 2025, 2 pages.
Japan Patent Office Action for corresponding Japanese Application No. 2023-559421, dated Nov. 27, 2025, 11 pages.

* cited by examiner

*Primary Examiner* — John Vincent Lawler
(74) *Attorney, Agent, or Firm* — Faegre Drinker Biddle & Reath LLC

(57) ABSTRACT

A metal-resin composite electromagnetic shielding material, in which N (N is an integer of 1 or more) metal layers and M (M is an integer of 1 or more) resin layers are laminated with adhesive layers interposed therebetween, wherein among the adhesive layers, in the adhesive layer closest to an outer surface of the metal-resin composite electromagnetic shielding material, when observing the adhesive layer from the resin layer side, an air bubble ratio in the adhesive layer is 4.5% or less.

7 Claims, No Drawings

METAL-RESIN COMPOSITE ELECTROMAGNETIC SHIELDING MATERIAL

CROSS REFERENCE TO RELATED APPLICATIONS

The present invention claims the benefit of priority to Japanese Patent Application No. 2021-186021 filed on Nov. 15, 2021 with the Japanese Patent Office, the entire contents of which are incorporated herein by reference in its entirety.

FIELD OF THE INVENTION

The present invention relates to a metal-resin composite electromagnetic shielding material. In particular, the present invention relates to a metal-resin composite electromagnetic shielding material that can be used as a covering material or exterior material for electrical/electronic devices.

BACKGROUND OF THE INVENTION

In recent years, interest in global environmental issues has increased worldwide, and environmentally friendly vehicles equipped with secondary batteries, such as electric vehicles and hybrid vehicles, are becoming more popular. Many of these vehicles use a method in which the DC current generated by an installed secondary battery is converted to AC current via an inverter, and then the necessary power is supplied to an AC motor to obtain driving force. Electromagnetic waves are generated due to switching operations of inverters or the like. Since electromagnetic waves can interfere with the reception of in-vehicle audio devices, wireless devices, and the like, countermeasures have been taken to shield electromagnetic waves by housing the inverter or the battery, motor, and the like together with the inverter in a metal case (Patent Literature 1: Japanese Patent Application Publication No. 2003-285002).

Furthermore, electromagnetic waves are emitted not only from automobiles but also from many electrical/electronic devices including communication devices, displays, and medical devices. Electromagnetic waves can cause precision equipment to malfunction, and there are also concerns about their effects on the human body. For this reason, various techniques have been developed to reduce the effects of electromagnetic waves using electromagnetic shielding materials. However, although the metal case disclosed in Patent Literature 1 has good electromagnetic shielding properties, it is heavy, resulting in lower fuel efficiency and increased cost. Therefore, it is desired to develop an electromagnetic shielding housing to replace the metal housing.

To reduce weight, techniques are being investigated to replace the metal case with resin. However, simply replacing metal with resin results in a loss of shielding properties. Therefore, as a technique for reinforcing the shielding properties lost due to replacement with resin, there is a technique of using a composite material of resin and metal as a forming material.

For example, a copper foil composite (laminate) formed by laminating a copper foil and a resin film is used as an electromagnetic shielding material (Patent Literature 2: Japanese Patent Application Publication No. H07-290449). The copper foil has electromagnetic shielding properties, and the resin film is laminated to reinforce the copper foil. Further, an electromagnetic shielding structure in which metal layers are laminated on the outer side and inner side of an intermediate layer made of an insulating material is also known (Patent Literature 3: Japanese Patent No. 4602680). Further, there is also an optical member for shielding electromagnetic waves, which comprise a base substrate and a laminated member formed on one surface of the base substrate and composed of a plurality of repeating unit films including a metal layer and a high refractive index layer (niobium pentoxide) (Patent Literature 4: Japanese Patent Application Publication No. 2008-21979).

PRIOR ART

Patent Literature

[Patent Literature 1] Japanese Patent Application Publication No. 2003-285002

[Patent Literature 2] Japanese Patent Application Publication No. H07-290449

[Patent Literature 3] Japanese Patent No. 4602680

[Patent Literature 4] Japanese Patent Application Publication No. 2008-21979

SUMMARY OF THE INVENTION

Metal foils (metal layers) such as copper foil used for electromagnetic shielding materials generally have a thickness of several micrometers to several tens of micrometers, so cracks are likely to occur when molding into a laminate with a resin film. Therefore, it is important to suppress cracking and improve formability.

Metal-resin composite materials with high formability can be formed into complex shapes, but if the extent of forming is large, the internal metal layer may crack during forming. Large cracks in the metal layer may lead to a reduction in shielding performance, so it is necessary to prevent this.

The present invention has been created in view of the above circumstances, and in one embodiment, an object of the present invention is to provide a metal-resin composite electromagnetic shielding material that has stable formability.

As a result of intensive study by the inventor, it has been found that, in a metal-resin composite electromagnetic shielding material, by controlling the ratio of air bubbles in the adhesive layer which is closest to the outer surface among the adhesive layers between each metal layer and resin layer, cracks in the metal layer that occur during forming can be suppressed, and the formability of the metal-resin composite electromagnetic shielding material can be improved. The present invention was completed based on the above findings, and is exemplified as below.

[1]

A metal-resin composite electromagnetic shielding material, in which N (N is an integer of 1 or more) metal layers and M (M is an integer of 1 or more) resin layers are laminated with adhesive layers interposed therebetween, wherein among the adhesive layers, in the adhesive layer closest to an outer surface of the metal-resin composite electromagnetic shielding material, when observing the adhesive layer from the resin layer side, an air bubble ratio in the adhesive layer is 4.5% or less.

[2]

The metal-resin composite electromagnetic shielding material according to [1], wherein the air bubble ratio is 4.0% or less.

[3]

The metal-resin composite electromagnetic shielding material according to [1] or [2], wherein each metal layer has a thickness of 4 to 100 μm.

[4]

The metal-resin composite electromagnetic shielding material according to any one of [1] to [3], wherein each resin layer has a thickness of 4 to 600 μm.

[5]

The metal-resin composite electromagnetic shielding material according to any one of [1] to [4], wherein a total thickness of the metal layers is 15 to 150 μm.

[6]

A covering material or exterior material for electrical/ electronic devices, comprising the metal-resin composite electromagnetic shielding material according to any one of [1] to [5].

[7]

An electrical/electronic device, comprising the covering material or exterior material according to [6].

According to one embodiment of the present invention, a metal-resin composite electromagnetic shielding material that has stable formability can be provided.

DETAILED DESCRIPTION OF THE INVENTION

Hereinafter, embodiments of the present invention will now be described in detail. It should be understood that the present invention is not intended to be limited to the following embodiments, and any change, improvement or the like of the design may be appropriately added based on ordinary knowledge of those skilled in the art without departing from the spirit of the present invention.

1. Metal Layer

According to an embodiment of the present invention, there are no particular restrictions on the material of the metal layer constituting the metal-resin composite electromagnetic shielding material, but from the viewpoint of improving shielding properties against alternating magnetic fields and alternating electric fields, it is preferable to use a metal material with excellent conductivity. Specifically, it is preferably formed of a metal with a conductivity of $1.0 \times 10^6$ S/m (value at 20° C.; the same applies hereinafter). The electrical conductivity of the metal is more preferably $10.0 \times 10^6$ S/m or more, even more preferably $30.0 \times 10^6$ S/m or more, and most preferably $50.0 \times 10^6$ S/m or more. Such metals include iron, which has a conductivity of about $9.9 \times 10^6$ S/m, nickel, which has a conductivity of about $14.5 \times 10^6$ S/m, aluminum, which has a conductivity of about $33.0 \times 10^6$ S/m, copper, which has a conductivity of about $58.0 \times 10^6$ S/m, and silver, which has a conductivity of about $61.4 \times 10^6$ S/m. Considering both conductivity and cost, it is practically preferable to use aluminum or copper. According to an embodiment of the present invention, all the metal layers constituting the metal-resin composite electromagnetic shielding material may be made of the same metal, or different metals may be used for each layer. Further, it is also possible to use alloys containing the above-mentioned metals.

Various surface treatment layers may be formed on the surface of the metal layer for the purpose of promoting adhesion, environmental resistance, heat resistance, rust prevention, and the like. For example, in order to increase the environmental resistance and heat resistance required when the metal surface is the outermost layer, Au plating. Ag plating, Sn plating, Ni plating, Zn plating, Sn alloy plating (Sn—Ag, Sn—Ni, Sn—Cu, and the like), chromate treatment, and the like can be performed. These processes may be combined. From the viewpoint of cost, Sn plating or Sn alloy plating is preferable. Further, for the purpose of increasing the adhesion between the metal layer and the resin layer, or between the metal layers, chromate treatment, roughening treatment, Ni plating, and the like can be performed. These processes may be combined. Roughening treatment is preferred because it facilitates adhesion. Furthermore, metal plating with high relative magnetic permeability can be provided for the purpose of increasing the shielding effect against DC magnetic fields. Examples of metal plating with high relative magnetic permeability include Fe—Ni alloy plating and Ni plating.

When using copper foil, it is preferable that it has high purity because it improves shielding performance, and the purity is preferably 99.5% by mass or more, more preferably 99.8% by mass or more. As the copper foil, rolled copper foil, electrolytic copper foil, metallized copper foil, and the like can be used, but a rolled copper foil with excellent flexibility and formability (formability includes drawing workability; the same applies hereinafter) is preferred. When alloying elements are added to copper foil to produce a copper alloy foil, the total content of these elements and inevitable impurities is preferably less than 0.5% by mass. In addition, in the copper foil, when a total of 50 to 2000 mass ppm of at least one selected from the group of Sn, Mn, Cr, Zn, Zr, Mg, Ni, Si, and Ag, and/or 10 to 50 mass ppm of P are contained, elongation is improved compared to pure copper foil given the same thickness, which is preferable.

The thickness of each metal layer constituting the metal-resin composite electromagnetic shielding material according to an embodiment of the present invention is preferably 4 μm or more. If the thickness is 4 μm or more, handling can be avoided from becoming difficult, and it is possible to prevent the ductility of the metal layer from significantly decreasing and the formability of the laminate from becoming insufficient. Further, if the thickness of each foil is less than 4 μm, it becomes necessary to laminate a large number of metal layers in order to obtain an excellent electromagnetic shielding effect, resulting in an increase in manufacturing costs. From this viewpoint, the thickness of each metal layer is more preferably 10 μm or more, even more preferably 12 μm or more, and even more preferably 15 μm or more. On the other hand, if the thickness of each foil exceeds 100 μm, formability may deteriorate, so the thickness of each foil is preferably 100 μm or less, more preferably 50 μm or less, even more preferably 45 μm or less, and even more preferably 40 μm or less.

The metal layer constituting the metal-resin composite electromagnetic shielding material may be one only, but from the viewpoint of improving formability and shielding performance, it is preferable that a plurality of metal layers constituting the metal-resin composite electromagnetic shielding material be laminated with resin layers interposed therebetween, and from the viewpoint of ensuring excellent electromagnetic shielding properties while reducing the total thickness of the metal-resin composite electromagnetic shielding material, it is more preferable that two or more metal layers are laminated with a resin layer interposed between. By laminating two or more metal layers with resin layers interposed therebetween, even if the total thickness of the metal layers is the same, the shielding effect is significantly improved compared to when the metal layer is a single layer or when two metal layers are laminated without interposing a resin layer. If the metal layers are laminated directly on each other, the shielding effect can be improved by increasing the total thickness of the metal layers, but in order to obtain a significant improvement effect, it is preferable to laminate the metal layers with resin layers interposed therebetween. In other words, by laminating a plurality of metal layers that make up a laminate with resin layers interposed therebetween, the total thickness of the metal layers required to obtain the same electromagnetic shielding effect can be reduced. Therefore, it is possible to achieve both weight reduction of the laminate and electromagnetic shielding effect.

This is considered to be because the presence of the resin layer between the metal layers increases the number of reflections of electromagnetic waves, thereby attenuating the electromagnetic waves. However, although the electromagnetic wave shielding properties are improved by increasing the number of laminated metal layers, increasing the number of laminated metal layers increases the number of lamination steps, which increases manufacturing costs. In addition, since the shielding improvement effect tends to be saturated, the number of metal layers constituting the metal-resin composite electromagnetic shielding material is preferably 5 or less, more preferably 4 or less, and more preferably 3 or less.

In one embodiment of the present invention, when a plurality of metal layers are formed, all the metal layers may be made of the same material, or different materials may be used for each layer. Furthermore, all the metal layers may have the same thickness, or each layer may have a different thickness.

Therefore, in the metal-resin composite electromagnetic shielding material according to an embodiment of the present invention, the total thickness of all metal layers can be 15 to 150 μm, or 100 μm or less, or 80 μm or less, or 60 μm or less.

2. Resin Layer

According to an embodiment of the present invention, in the metal-resin composite electromagnetic shielding material, by sandwiching resin layers between the metal layers, the electromagnetic shielding effect can be significantly improved when laminating a plurality of metal layers. If the metal layers are laminated directly on each other, the shielding effect can be improved by increasing the total thickness of the metal layers, but in order to obtain a significant improvement effect, it is preferable to laminate the metal layers with resin layers interposed therebetween. This is considered to be because the presence of the resin layers between the metal layers increases the number of reflections of electromagnetic waves, thereby attenuating the electromagnetic waves.

It is preferable that the resin layer has a large difference in impedance from the metal layer in order to obtain an excellent electromagnetic shielding effect. In order to generate a large impedance difference, it is necessary that the resin layer has a small dielectric constant, and specifically, it is preferably 10 (value at 20° C., the same applies hereinafter) or less, more preferably 5.0 or less, and even more preferably 3.5 or less. In principle, the dielectric constant cannot become smaller than 1.0. Commonly available materials can have a value as low as around 2.0, and even if the value is lowered even closer to 1.0, the increase in shielding effectiveness is limited, but the material itself is special and expensive. Considering the balance between cost and function, the dielectric constant is preferably 2.0 or more, more preferably 2.2 or more.

Specifically, from the viewpoint of formability, synthetic resin is particularly preferred as the material constituting the resin layer. It is also possible to mix fiber reinforcing materials such as carbon fibers, glass fibers, and aramid fibers into the resin layer. Further, from the viewpoint of improving shielding properties, a magnetic material may be mixed in the resin layer within a range that does not affect the present invention. As a synthetic resin, from the viewpoint of easy availability and formability, mention can be made to polyesters such as PET (polyethylene terephthalate), PEN (polyethylene naphthalate) and PBT (polybutylene terephthalate); olefin resins such as polyethylene and polypropylene; polyamide, polyimide, liquid crystal polymer, polyacetal, fluororesin, polyurethane, acrylic resin, epoxy resin, silicone resin, phenolic resin, melamine resin, ABS resin, polyvinyl alcohol, urea resin, polyvinyl chloride, polycarbonate, polystyrene, styrene-butadiene rubber, and the like. Among these, PET, PEN, polyamide, and polyimide are preferred for reasons of formability and cost. The synthetic resin can also be an elastomer such as urethane rubber, chloroprene rubber, silicone rubber, fluororubber, styrene type, olefin type, vinyl chloride type, urethane type, or amide type. According to one embodiment of the present invention, all the resin layers used in the metal-resin composite electromagnetic shielding material may be made of the same resin material, or different resin materials may be used for each layer. From the viewpoint of formability, it is preferable that a part or all of the resin layers are insulating layers.

As will be described later, the ratio of air bubbles in the adhesive layer is observed through the resin layer, so from the viewpoint of ease of observation, the resin layer is preferably semitransparent. Specifically, the resin layer has a haze value is preferably 40% or less.

The resin material can be laminated in the form of a film or fiber. Although the resin layer may be formed by applying an uncured resin composition to the metal layer and then curing it, it is preferable to form a resin film that can be attached to the metal layer for ease of manufacture. In particular, PET film can be suitably used. In particular, by using a biaxially stretched film as the PET film, the strength of the shield material can be increased.

The thickness of the resin layer is not particularly limited, but if the thickness of each resin layer is thinner than 4 μm, the (elongation) breaking strain of the shielding material tends to decrease, so the thickness of each resin layer is preferably 4 μm or more, more preferably is 7 μm or more, more preferably 9 μm or more, even more preferably 10 μm or more, even more preferably 20 μm or more, even more preferably 40 μm or more, even more preferably 80 μm or more, and even more preferably 100 μm or more. On the other hand, even if the thickness of each layer exceeds 600 μm, the (elongation) breaking strain of the shielding material tends to decrease. Therefore, the thickness of each resin layer is preferably 600 μm or less, more preferably 500 μm or less, more preferably 400 μm or less, preferably 250 μm or less, and even more preferably 200 μm or less. In one embodiment of the present invention, all resin layers may have the same thickness, or each layer may have a different thickness.

Generally, resin layers have higher ductility than metal layers. Therefore, by supporting both sides of each metal layer with resin layers, the ductility of the metal layer, which is for shielding, is significantly improved, and the formability of the laminate is significantly improved. From the viewpoint of improving formability, it is preferable to laminate the metal layers with resin layers interposed therebetween rather than directly laminating the metal layers.

Various surface treatments may be performed on the surface of the resin layer for the purpose of promoting adhesion with the metal layer. For example, adhesion to the shielding metal layer can be improved by applying a primer coat or corona treatment to the surface of the resin layer that is attached to the metal layer for shielding.

3. Adhesive Layer

In one embodiment of the present invention, the metal layers and the resin layers are laminated via adhesive layers. There are no particular restrictions on the adhesive, and mention can be made to acrylic resin type, epoxy resin type, urethane type, polyester type, silicone resin type, vinyl acetate type, styrene-butadiene rubber type, nitrile rubber type, phenol resin type, and cyanoacrylate type. For reasons of ease of manufacture and cost, urethane type, polyester type, and vinyl acetate type materials are preferred. In one embodiment of the present invention, when a plurality of adhesive layers is formed, all the adhesive layers may be made of the same material, or different materials may be used for each layer.

Adhesives generally have lower strength than resin layers or metal layers. Therefore, if the adhesive layer is too thick, it tends to inhibit the improvement in ductility of the metal layer by laminating the resin layer. On the other hand, if the adhesive layer is too thin, it will be difficult to apply the adhesive to the entire interface between the metal layer and the resin layer, resulting in unbonded areas. Therefore, the thickness of the adhesive layer is preferably 1 μm or more and 20 μm or less, more preferably 1.5 μm or more and 15 μm or less, and even more preferably 2 μm or more and 10 μm or less.

4. Electromagnetic Shielding Material

In one embodiment of the invention, there is provided a metal-resin composite electromagnetic shielding material, in which N (N is an integer of 1 or more) metal layers and M (M is an integer of 1 or more) resin layers are laminated with adhesive layers interposed therebetween, wherein among the adhesive layers, in the adhesive layer closest to the outer surface of the metal-resin composite electromagnetic shielding material, when observing the adhesive layer from the resin layer side, an air bubble ratio in the adhesive layer is 4.5% or less.

N is not particularly limited as long as it is an integer of 1 or more, and a higher electromagnetic shielding effect can be obtained by increasing N. However, as mentioned above, typically N is 1, 2, 3, 4, or 5.

M is not particularly limited as long as it is an integer of 1 or more, but typically, in order to sandwich the resin layers between the metal layers and improve the electromagnetic shielding effect, M=N+1 or M=N−1 or M=N. If both outer surfaces are metal layers, the metal layers are peeled off and the observation described below is performed from the adjacent resin layer side. In this case, the metal layer and adhesive layer on the opposite side of the resin layer may be peeled off as appropriate so that observation from the resin layer side can be conducted.

In one embodiment of the present invention, among the adhesive layers, in the adhesive layer closest to the outer surface of the metal-resin composite electromagnetic shielding material, when observing the adhesive layer from the resin layer side, an air bubble ratio in the adhesive layer is 4.5% or less.

Among the adhesive layers between each metal layer and each resin layer, by setting the ratio of air bubble in the adhesive layer closest to the outer surface of the metal-resin composite electromagnetic shielding material to 4.5% or less, when the metal-resin composite electromagnetic shielding material is subjected to forming processes such as punching or drawing, it is possible to effectively suppress the occurrence of cracks in the metal layers. Although there is no intention to limit the present invention by theory, it is assumed that by lowering the proportion of air bubbles in the adhesive layer, the adhesion between the resin layer and the metal layer becomes stronger, the supporting effect of the resin layer becomes significant, and the strain is less likely to concentrate, and as a result, cracks in the metal layer is less likely to occur.

When performing forming processes such as punching and drawing, the metal layer where strain is most likely to accumulate is the metal layer closest to the outer surface where the deformation is greatest, so it is effective to reduce the ratio of air bubbles in the adhesive layer that adheres to this metal layer. In addition, when there are two adhesive layers closest to the outer surface of the metal-resin composite electromagnetic shielding material, for example, in cases of laminating according to the order of resin layer/adhesive layer 1/metal layer/adhesive layer 2/resin layer/adhesive layer 3/metal layer/adhesive layer 4/resin layer, it is intended that the ratio of air bubbles in at least one of adhesive layer 1 and adhesive layer 4 is 4.5% or less. Of course, in a preferred embodiment of the present invention, when there is a plurality of metal layers, each metal layer is preferably adhered to the resin layer via an adhesive layer, and it is preferable to control the ratio of air bubbles in the adhesive layer adhering to each metal layer to 4.5% or less.

From the above viewpoint, the ratio of air bubbles in the adhesive layer adhering to the metal layer is preferably 4.0% or less, more preferably 3.8% or less, even more preferably 3.5% or less, and even more preferably 3.0% or less. There is no particular lower limit to the ratio of air bubbles in the adhesive layer that adheres to the metal layer, but in view of the balance between the effect of improving formability and manufacturing cost, the ratio of air bubbles is, for example, 0.01% or more, typically 0.1% or more.

The method for measuring the ratio of air bubbles in the adhesive layer adhering to the metal layer is as follows. That is, the adhesive layer is observed through the resin layer from the side of the resin layer adjacent to the metal layer after lamination. The detailed conditions for observation are as follows.

Measuring device: VHX-6000 manufactured by Keyence Corporation

Lens: Swing head zoom lens VH-ZST-ZS20

Illumination method: Coaxial epi-illumination (circularly polarized state)

Magnification: 50× (*½ inch camera, magnification on 15 inch monitor)

Observation distance: 15 mm

Image size: 1600×2000

Inclination angle: 0 degrees

Measurement range (measurement area): 33.62 mm$^2$

Polarized light observation (adjust the polarized light knob so that air bubbles appear white)

Measurement method: in order of Measurement, Special measurement, and Automatic area measurement (particles count)

Brightness setting: ON (manual) (adjust brightness so that bubbles are selected)

Hue setting: OFF

Saturation setting: OFF

Fill in the blanks: OFF

Small particle removal: OFF

The captured image is binarized to separate it into air bubbles and the base material, and the number of pixels for black (=0) and white (=255) are set as black (=0)=$N_0$ and white (=255)=$N_{255}$. Assuming that white represents air bubbles, the ratio of pixels that are air bubbles are calculated using the following formula.

$$N_{255}/N_0 + N_{255}$$

There are no particular limitations on the method for controlling the ratio of air bubbles in the adhesive layer, but examples include a method of smoothing the adhesive layer after application and before bonding to reduce unevenness of the adhesive, and a method in which an adhesive is applied to the metal layer instead of the resin layer and then lamination is performed.

The metal-resin composite electromagnetic shielding material according to each embodiment of the present invention can be used for various electromagnetic shielding applications, particularly for coating materials or exterior materials for electric/electronic devices (for example, inverters, communication devices, resonators, electron tubes/discharge lamps, electric heating equipment, motors, generators, electronic components, printed circuits, medical equipment, and the like), covering materials for harnesses and communication cables connected to electrical/electronic devices, electromagnetic shielding sheets, electromagnetic shielding panels, electromagnetic shielding bags, electromagnetic shielding boxes, electromagnetic shielding rooms, and the like. Furthermore, in order to improve the electromagnetic shielding effect, an electromagnetic shielding sheet such as a magnetic sheet may be attached to the inside and/or the outside of the metal-resin composite electromagnetic shielding material according to the present invention, within an extent that does not affect the present invention.

EXAMPLES

Hereinafter, Examples of the present invention will be shown along with Comparative Examples, but these are provided for better understanding of the present invention and its advantages, and are not intended to limit the invention.

Example 1

A rolled copper foil (thickness: 18 μm, electrical conductivity at 20° C.: 58.0×10⁶ S/m) was prepared as the metal layer, and a polyethylene terephthalate film (thickness: 100 μm, relative dielectric constant at 20° C.: 3.0) was prepared as the resin layer, and a urethane adhesive was prepared as the adhesive. In each Example, the areas of the bonding surfaces of the metal layers and the resin layers were the same, and the layers were laminated so that they did not protrude from each other. During lamination, a predetermined amount of urethane adhesive was applied to the metal layer side so that the thickness was 5 μm. In order to promote the curing reaction, the metal layers and the resin layers were laminated in close contact by holding in a constant temperature bath at 40° C. for 7 days. In order to measure the ratio of air bubbles as described below, once a laminate structure of metal layer/adhesive layer/resin layer was formed, an adhesive layer/resin layer was laminated in this order on the metal layer side of the laminate. The order of the finally obtained laminated structure was resin layer/ adhesive layer/metal layer/adhesive layer/resin layer. The laminated structure of each Example is shown in Table 1. "PET" means polyethylene terephthalate (resin layer), and "Metal" means metal layer. Although there is an adhesive layer between each resin layer and each metal layer, the description is omitted in Table 1.

Comparative Example

A metal-resin composite of a Comparative Example was prepared under the same conditions as in the Example except that the urethane adhesive was applied to the resin layer side instead of the metal layer side at the time of lamination.

Measurement of Bubble Ratio

After the laminate structure of the metal layer/adhesive layer/resin layer was formed, it was observed from the resin layer side using a Microscope VHX6000 manufactured by Keyence Corporation under 50× polarized light through the resin layer according to the conditions described above. The adhesive layer was observed in an area of 33.6 mm². During the observation, the polarization knob was adjusted to obtain a contrast between the air bubbles and the metal foil.

The captured image was binarized to separate the photographed image into air bubbles and the base material, and the number of pixels for black (=0) and white (=255) were set as black (=0)=$N_0$ and white (=255)=$N_{255}$. Assuming that white represents air bubbles, the ratio of pixels that were air bubbles were calculated using the following formula.

$$N_{255}/N_0 + N_{255}$$

Evaluation of Formability

The forming limit was evaluated using a mold for FLD (forming limit diagram). The mold was designed by reducing the size described in ISO-12004-2-2008 by 25%. The dimensions of the punch were d=22.5 mm and R portion Rf=2.5 mm. The initial pressing pressure of the mold was 4000 N, which was sufficient to hold down the metal-resin composite test piece. For the laminate of each Example, a circular test piece with a diameter of 60 mm was cut out, grid-like markings were made at a pitch of 1 mm near the center, and each test piece was forming processed by increasing the punch extrusion depth by steps of 0.5 mm. Test pieces n=3 were prepared for each depth, and observed with a microscope at arbitrary four squares of the grid near the center of each test piece. The punch extrusion depth was recorded when 50% or more (that is, 6 or more out of 12 total observed locations) of cracks penetrating the metal layer were observed. Then, the maximum strain and minimum strain of each square at the punch extrusion depth were measured using a microscope, and assuming the maximum depth at which no cracks penetrating the metal layer was the forming limit, VFL (Value of Forming Limit) was calculated from the following formula. The larger the VFL is, the higher the formability is. The results are shown in Table 1.

$$VFL = \sqrt{\varepsilon_1^2 + \varepsilon_2^2}$$

in which, $\varepsilon_1$ is the maximum strain within the square, and $\varepsilon_2$ is the minimum strain within the square.

TABLE 1

| | Metal foil | Metal foil thickness | Resin | Resin thickness | Configuration | Ratio of air bubbles | VFL | Adhesive applied surface | Formability |
|---|---|---|---|---|---|---|---|---|---|
| Example 1-1 | Cu | 18 μm | PET | 100 μm | PET/Metal/PET | 0.2% | 0.333 | Metal | ○ |
| Example 1-2 | Cu | 18 μm | PET | 100 μm | PET/Metal/PET | 2.5% | 0.342 | Metal | ○ |
| Example 1-3 | Cu | 18 μm | PET | 100 μm | PET/Metal/PET | 3.5% | 0.284 | Metal | ○ |
| Comparative Example 1 | Cu | 18 μm | PET | 100 μm | PET/Metal/PET | 24.5% | 0.212 | PET | x |

Example 2

As presumed Examples and Comparative Examples, test results were predicted for the cases where the metal layer was changed to aluminum foil. The results are shown in Table 2.

TABLE 2

| | Metal foil | Metal foil thickness | Resin | Resin thickness | Configuration | Ratio of air bubbles | VFL | Adhesive applied surface | Formability |
|---|---|---|---|---|---|---|---|---|---|
| Example 2-1 | Al | 18 μm | PET | 100 μm | PET/Metal/PET | Same level as Example 1-1 | Slightly higher than Example 1-1 | Metal | ○ |
| Example 2-2 | Al | 18 μm | PET | 100 μm | PET/Metal/PET | Same level as Example 1-2 | Slightly higher than Example 1-2 | Metal | ○ |
| Example 2-3 | Al | 18 μm | PET | 100 μm | PET/Metal/PET | Same level as Example 1-3 | Slightly higher than Example 1-3 | Metal | ○ |
| Comparative Example 2 | Al | 18 μm | PET | 100 μm | PET/Metal/PET | Same level as Comparative Example 1 | Slightly higher than Comparative Example 1 | PET | x |

Since it is expected that the coating state of the adhesive layer will not be greatly affected by the difference in the composition of the metal layer, it was presumed that the ratio of air bubbles measured in Examples 2-1 to 2-3 and Comparative Example 2 was the same as that of Example 1-1, 1-2, 1-3, and Comparative Example 1, respectively. On the other hand, since aluminum foil generally has a lower Young's modulus than copper foil, the overall VFL is expected to be slightly higher than that in Examples 1-1, 1-2, 1-3 and Comparative Example 1. This is because the lower the Young's modulus is, the softer it is, so it is less likely that force will be applied to the adhesive interface during forming. However, similar to the relationship between Examples 1-1, 1-2, 1-3 and Comparative Example 1, the VFL of Examples 2-1, 2-2, 2-3 was expected to be higher than that of Comparative Example 2.

Example 3

As presumed Examples and Comparative Examples, test results were predicted when the laminated structure was changed. The results are shown in Table 3.

TABLE 3

| | Metal foil | Metal foil thickness | Resin | Resin thickness | Configuration | Ratio of air bubbles | VFL | Adhesive applied surface | Formability |
|---|---|---|---|---|---|---|---|---|---|
| Example 3-1 | Cu | 18 μm | PET | 100 μm | PET/Metal/PET/Metal/PET/Metal | Same as Example 1-1 | | Metal | ○ |
| Example 3-2 | Cu | 18 μm | PET | 100 μm | PET/Metal/PET/Metal/PET/Metal | Same as Example 1-2 | | Metal | ○ |
| Example 3-3 | Cu | 18 μm | PET | 100 μm | PET/Metal/PET/Metal/PET/Metal | Same as Example 1-3 | | Metal | ○ |
| Comparative Example 3 | Cu | 18 μm | PET | 100 μm | PET/Metal/PET/Metal/PET/Metal | Same as Comparative Example 1 | | PET | x |

Even if the total number of laminated layers increases, the ratio of air bubbles in the adhesive layer closest to the outer surface is hardly affected, so it was presumed that the ratio of air bubbles and VFL measured in Examples 3-1, 3-2, 3-3 and Comparative Example 3 are comparable to those of Examples 1-1, 1-2, 1-3 and Comparative Example 1, respectively.

Discussion

As can be seen from Tables 1 to 3, the metal-resin composite electromagnetic shielding materials of the Examples of the present invention have a VFL larger than that of the Comparative Examples, and the formability was excellent because the ratio of air bubbles in the adhesive layer closest to the outer surface is 4.5% or less.

The invention claimed is:

1. A metal-resin composite electromagnetic shielding material, in which N (N is an integer of 1 or more) metal layers and M (M is an integer of 1 or more) resin layers are laminated with adhesive layers interposed therebetween, wherein among the adhesive layers, in the adhesive layer closest to an outer surface of the metal-resin composite electromagnetic shielding material, when observing the adhesive layer from the resin layer side, an air bubble ratio in the adhesive layer is 0.01% or more and 4.5% or less.

2. The metal-resin composite electromagnetic shielding material according to claim 1, wherein the air bubble ratio is 0.01% or more and 4.0% or less.

3. The metal-resin composite electromagnetic shielding material according to claim 1, wherein each metal layer has a thickness of 4 to 100 μm.

4. The metal-resin composite electromagnetic shielding material according to claim 1, wherein each resin layer has a thickness of 4 to 600 μm.

5. The metal-resin composite electromagnetic shielding material according to claim 1, wherein a total thickness of the metal layers is 15 to 150 μm.

6. A covering material or exterior material for electrical/electronic devices, comprising the metal-resin composite electromagnetic shielding material according to claim 1.

7. An electrical/electronic device, comprising the covering material or exterior material according to claim 6.

* * * * *